(12) United States Patent
Choi et al.

(10) Patent No.: US 9,232,646 B2
(45) Date of Patent: Jan. 5, 2016

(54) HIGH SPEED DIFFERENTIAL WIRING IN GLASS CERAMIC MCMS

(71) Applicant: International Business Machines Corporation, Armonk, NY (US)

(72) Inventors: Jinwoo Choi, Austin, TX (US); Daniel M. Dreps, Georgetown, TX (US); Rohan U. Mandrekar, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 14/102,832

(22) Filed: Dec. 11, 2013

(65) Prior Publication Data

US 2015/0144252 A1    May 28, 2015

Related U.S. Application Data

(63) Continuation of application No. 14/087,341, filed on Nov. 22, 2013.

(51) Int. Cl.

| | |
|---|---|
| H01L 23/528 | (2006.01) |
| H05K 1/02 | (2006.01) |
| C04B 37/00 | (2006.01) |
| H05K 1/03 | (2006.01) |
| H05K 3/46 | (2006.01) |

(Continued)

(52) U.S. Cl.
CPC ............ *H05K 1/0298* (2013.01); *C04B 37/006* (2013.01); *H01L 23/528* (2013.01); *H01L 23/5283* (2013.01); *H05K 1/0245* (2013.01); *H05K 1/0306* (2013.01); *H05K 3/1291* (2013.01); *H05K 3/4667* (2013.01); *H01L 21/486* (2013.01); *H01L 21/4857* (2013.01); *H01L 21/4867* (2013.01); *H01L 23/13* (2013.01); *H01L 23/49822* (2013.01); *H01L 23/49827* (2013.01); *H01L 23/5226* (2013.01);
(Continued)

(58) Field of Classification Search
CPC ....................................................... C04B 37/006
See application file for complete search history.

(56) References Cited

U.S. PATENT DOCUMENTS

| 4,622,058 A | 11/1986 | Leary-Renick et al. |
| 4,939,021 A * | 7/1990 | Aoki et al. ..................... 428/209 |

(Continued)

FOREIGN PATENT DOCUMENTS

| JP | 06342858 A | 12/1994 |
| JP | 07095134 A | 4/1995 |
| JP | 2001015925 A | 1/2001 |
| KR | 100755516 B1 | 9/2007 |

OTHER PUBLICATIONS

Disclosed Anonymously, "Method for crosstalk cancellation by alternating the signal transition polarity between lanes of an EPM data interface"., ip.com, IPCOM000132449D, Dec. 16, 2005.
U.S. Appl. No. 14/087,341, filed Nov. 22, 2013, Titled: "High Speed Differential Wiring in Glass Ceramic MCMS".

*Primary Examiner* — Yu Chen
*Assistant Examiner* — Nilufa Rahim
(74) *Attorney, Agent, or Firm* — Scully, Scott, Murphy & Presser, P.C.

(57) ABSTRACT

The embodiments of the present invention relate generally to the fabrication of integrated circuits, and more particularly to a structure and method for fabricating differential wiring patterns in multilayer glass-ceramic (MLC) modules. A structure and method of forming a MLC having layers with staggered, or offset, pairs of lines formed directly on one another are disclosed. In addition, a structure and method of forming a MLC having layers with staggered, or offset, pairs of lines that periodically reverse polarity are disclosed.

12 Claims, 9 Drawing Sheets

(51) Int. Cl.
  *H01L 21/48* (2006.01)
  *H05K 3/12* (2006.01)
  *H01L 23/522* (2006.01)
  *H05K 1/09* (2006.01)
  *H01L 23/13* (2006.01)
  *H01L 23/498* (2006.01)
  *H05K 3/00* (2006.01)
  *H05K 3/24* (2006.01)

(52) U.S. Cl.
  CPC ......... *H01L2924/0002* (2013.01); *H05K 1/092* (2013.01); *H05K 3/005* (2013.01); *H05K 3/1216* (2013.01); *H05K 3/1233* (2013.01); *H05K 3/245* (2013.01); *H05K 2201/035* (2013.01); *H05K 2201/0338* (2013.01); *H05K 2201/09272* (2013.01); *H05K 2201/09709* (2013.01); *H05K 2203/0126* (2013.01); *H05K 2203/063* (2013.01)

(56) References Cited

U.S. PATENT DOCUMENTS

| | | | |
|---|---|---|---|
| 5,260,519 A | | 11/1993 | Knickerbocker et al. |
| 5,430,247 A | | 7/1995 | Bockelman |
| 5,726,863 A | * | 3/1998 | Nakayama et al. ........... 361/794 |
| 6,096,565 A | | 8/2000 | Goland et al. |
| 6,238,741 B1 | | 5/2001 | Blazick et al. |
| 6,406,778 B1 | | 6/2002 | Natarajan et al. |
| 6,423,909 B1 | | 7/2002 | Haynie et al. |
| 6,442,041 B2 | | 8/2002 | Rehm et al. |
| 7,247,363 B2 | | 7/2007 | Natarajan |
| 7,504,587 B2 | | 3/2009 | Masu et al. |
| 8,119,919 B2 | | 2/2012 | Tagi et al. |
| 8,299,871 B2 | | 10/2012 | Carrillo-Ramirez |
| 2005/0099240 A1 | | 5/2005 | Lin et al. |
| 2007/0109720 A1 | * | 5/2007 | Kamei ...................... 361/321.2 |
| 2009/0184910 A1 | | 7/2009 | Lee et al. |

* cited by examiner

HIGH SPEED DIFFERENTIAL WIRING IN GLASS CERAMIC MCMS

CROSS REFERENCE

The present application is a continuation of and claims priority under 35 U.S.C. §120 of U.S. patent application Ser. No. 14/087,341 filed on Nov. 22, 2013, which is incorporated by reference in its entirety.

BACKGROUND

The present invention relates generally to electronic components such as multilayer glass ceramic chip modules and more particularly, to differential wiring patterns in the multilayer glass ceramic chip modules.

As integrated circuit (IC) technology advances towards large-scale integration and high performance multilayer multi-chip modules (MCMs), it is necessary to provide MCM interconnect packaging that is compatible with the demands of the associated circuitry. In other words, the reduction of signal delay, package impedance, and cross-talk in the wiring of MCM packaging has become extremely important. Present day packaging used in MCMs is typically made of multiple layers of glass-ceramics (hereinafter "ceramics"), commonly referred to as multilayer ceramic (MLC) modules. MLC modules are typically composed of multiple layers of ceramics, or other insulating material of relatively high thermal conductivity with conductors formed on the respective surfaces and through-holes (via) formed through the layers.

In general, a MLC module is formed by stacking and bonding together flexible sheets of ceramic material, commonly referred to as ceramic greensheets. Greensheet segments of a desired size and configuration may be pre-punched to provide via holes and, may be patterned, typically by a screen printing technique, with a conductive paste that creates a conductive circuit pattern on the surface of the greensheet as well as fills the via holes to form interlayer contact lines. Patterned greensheets are assembled in a stack, pressed, and subsequently sintered in an oven at a relatively high temperature. Upon sintering, organics, such as binders, dispersants, plasticizers, thixotropes, solvents, etc., are burned off providing a rigid unitary ceramic body having interior interconnected conductive patterns.

Typically, the wiring in a MLC module is laid out in a meshed plane (i.e., repeating pairs of horizontal lines connected to repeating pairs of vertical interlayer lines that form a structure resembling repeating cubes). This mesh pattern may result in significant vertical coupling between signal lines. A common solution to this problem is to include a blank layer between each layer of horizontal lines to provide additional insulation. However, as the need for higher bandwidth at low cost has increased, the reduction of the overall number of layers in carriers has become a priority. Unfortunately, eliminating the blank layer to minimize vertical density results in poor signal to crosstalk ratio at high frequencies and limits the viability of this packaging technology for high baud rates.

SUMMARY

According to one embodiment, a method is disclosed. The method may include forming a glass-ceramic carrier having multiple layers formed directly on top of one another. The glass-ceramic carrier may have a first layer that contains a first left line and a first right line, a second layer that contains a second left line and a second right line which are vertically offset from the first left line and the first right line, and a third layer that contains a third left line and a third right line which are vertically aligned with the first pair of lines. The first left line may have a polarity and the first right line may have an opposite polarity. The second left line may have the same polarity as the first left line and the second right line may have the same polarity as the first right line. The third left line may have the same polarity as the first left line and the third right line may have the same polarity as the first right line.

The method may also include forming a first contact and a second contact from an intervening portion of the third layer located between the third left line and the third layer right line to an intervening portion of the first layer located between the first left line and the first right line, through an entire thickness of the second layer. The first contact may provide an electrical connection between the third layer right line and the first layer left line which may have the same polarity as the second right line. The second contact may provide an electrical connection between the third layer left line and the first layer right line which have the same polarity as the second layer left line.

According to another embodiment, a method is disclosed. The method may include: forming a first pair lines on a first greensheet, the first pair of lines including a first layer left line and a first layer right line separated by an intervening portion of the first greensheet; positioning a second greensheet on the first greensheet; forming a second pair of lines on the second greensheet, the second pair of lines including a second layer left line aligned vertically with the first layer right line and a second layer right line separated by an intervening portion of the second greensheet; positioning a third greensheet on the second greensheet; forming a third pair of lines on the third greensheet, the third pair of lines comprising a third layer left line aligned vertically with the first layer left line and a third layer right line aligned vertically with the second layer left line separated by an intervening portion of the third greensheet; and performing a sintering process to harden and join the first greensheet, the second greensheet, and the third greensheet together to form a solid glass-ceramic multilayer carrier.

The method may also include: forming a first layer left contact in the intervening portion of the first greensheet connected to the first layer left line; forming a first layer right contact in the intervening portion of the first greensheet connected to the first layer right line; forming a first contact through an entire thickness of the second greensheet vertically aligned with and contacting the first layer left contact; forming a second contact through the entire thickness of the second greensheet vertically aligned with and contacting the first layer right contact; forming a third layer left contact through an entire thickness of the third greensheet in the intervening portion of the third greensheet connected to the third layer left line and vertically aligned with and contacting the second contact; and forming a third layer right contact through an entire thickness of the third greensheet in the intervening portion of the third greensheet connected to the third layer right line and vertically aligned with and contacting the first contact.

According to another embodiment, a structure is disclosed. The structure may include: a first glass-ceramic layer; a first pair of lines on the first glass-ceramic layer including a first layer left line and a first layer right line separated by an intervening portion of the first glass-ceramic layer; a second glass-ceramic layer on the first glass-ceramic layer; a second pair of lines on the second glass-ceramic layer including a second layer left line aligned with the first layer right line and a second layer right line separated by an intervening portion of the second glass-ceramic layer; a third glass-ceramic layer on the second glass-ceramic layer; and a third pair of lines on the third glass-ceramic layer including a third layer left line vertically aligned with the first layer left line and a third layer right line vertically aligned with the second layer left line separated by an intervening portion of the third glass-ceramic layer.

The structure may also include: a first layer left contact on the intervening portion of the first glass-ceramic layer connected to the first layer left line; a first layer right contact on the intervening portion of the first glass-ceramic layer connected to the first layer right line; a first contact vertically aligned with and contacting the first layer left contact extending through an entire thickness of the second glass-ceramic layer; a second contact vertically aligned with and contacting the first layer right contact extending through the entire thickness of the second glass-ceramic layer; a third layer left contact vertically aligned with and contacting the second contact extending through an entire thickness of the third glass-ceramic layer in the intervening portion of the third glass-ceramic layer connected to the third layer left line; and a third layer right contact vertically aligned with and contacting the first contact extending through the entire thickness of the third glass-ceramic layer in the intervening portion of the third glass-ceramic layer connected to the third layer right line.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
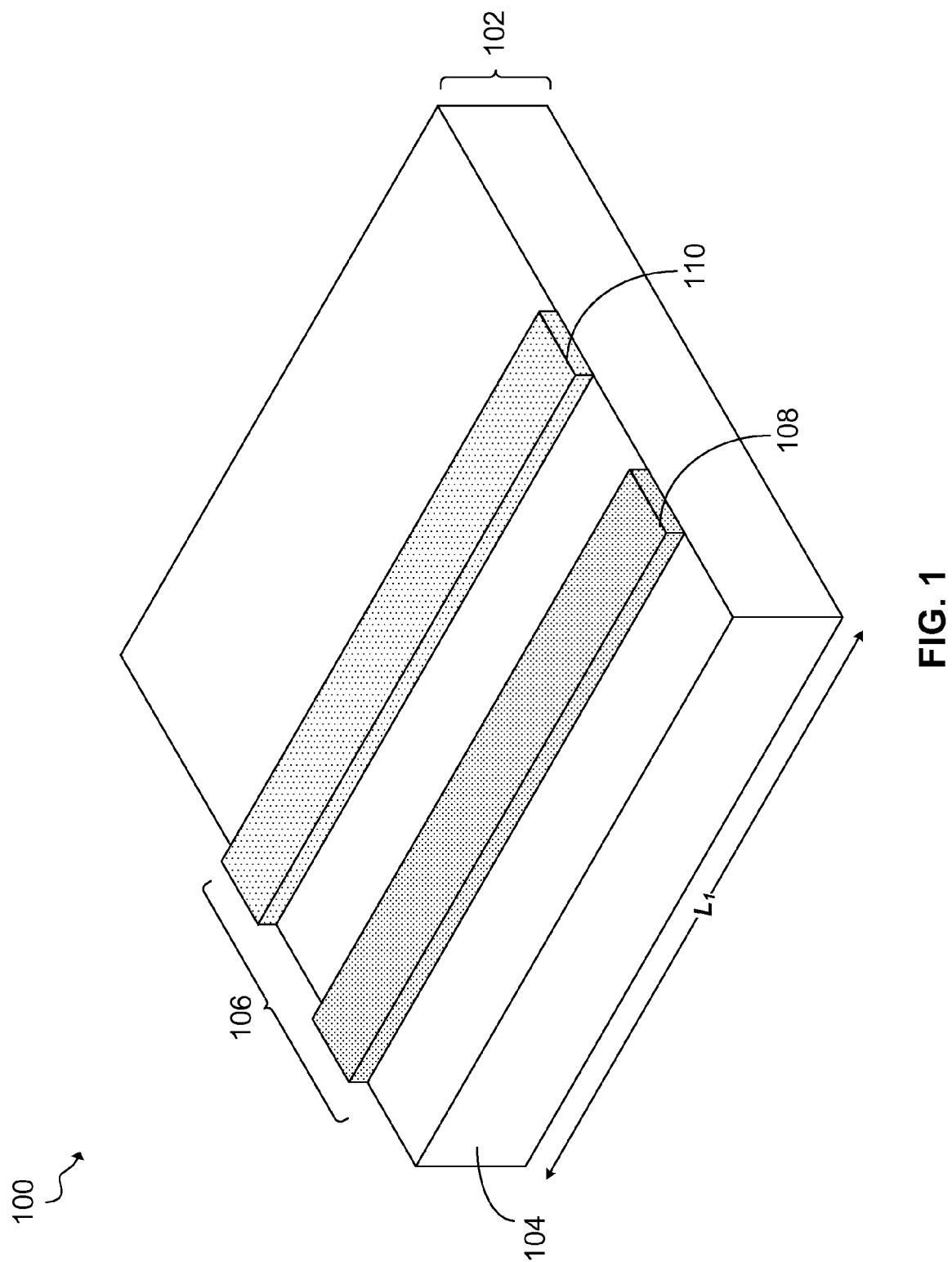
FIG. 1 is an isometric view illustrating forming a first pair of lines on a first greensheet to form a first layer, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The embodiments of the present invention relate to semiconductor device manufacturing, and more particularly to a structure and method for fabricating differential wiring patterns in MLC modules. Embodiments by which to reduce signal delay, package impedance, and cross-talk in the wiring of MCM packaging while improving package density are described in detail below with reference to FIGS. 1-9. One embodiment may be described in detail below with reference to FIGS. 1-4. Another embodiment may be described in detail below with reference to FIGS. 5-9.

In one embodiment, MLC package density may be improved while signal delay, package impedance, and cross-talk may be reduced by eliminating the blank layer typically formed between two layers containing lines and forming layers directly over one another, each layer having vertically staggered pairs of lines. This embodiment may be described in detail below with reference to FIGS. 1-4.

Referring now to FIG. 1, an isometric view of structure 100 is shown. FIG. 1 illustrates forming a first pair of lines 106 (hereinafter "first layer lines") on a first greensheet 104 in a first layer 102. The first greensheet 104 may generally have a rectangular or square shape, and may be segment of a larger ceramic greensheet. The first greensheet 104 may be any conventional thin or thick greensheet commonly used in the art. It is noted that the thickness of a greensheet is a relative measure and it is understood to include any thickness the design warrants and as thick as one could cast and personalize the greensheet. It is contemplated that the first greensheet segment 104 has a thickness sufficient to form vias and undergo screen printing with conventional techniques without any detrimental pattern distortion and radial error. In one embodiment, the first greensheet segment 104 has a thickness ranging from about 0.1 mm to about 6 mm. The first greensheet segment 104 may be composed of any known greensheet material including, but not limited to, alumina, ceramics, aluminum nitride, borosilicate glass, polymeric binders, polymers, metal, plastic, oxides of ceramics, and glass frit and grit. In one embodiment, the first greensheet segment 104 may include one or more pre-punched vias (not shown) extending through the entire thickness of the first greensheet segment 104 in order to connect the first layer 102 to other layers.

The first layer lines 106 may be composed of a paste and may be formed by any conventional screen printing process known in the art. In one embodiment, a mask (not shown) having a feature opening with the same pattern as the first layer lines 106 may be placed on or over the first greensheet segment 104. The mask (not shown) may be a metal mask suitable for extrusion screening or a mesh mask suitable for silk screen printing. A nozzle (not shown) may then screen the paste onto the mask (not shown) so that the paste is deposited onto the first greensheet segment 104 in the chosen pattern. In one embodiment, the nozzle (not shown) may be relatively pliable and may be composed of materials such as, for example, polyurethane, elastomers, thermoplastics, natural rubber, silicon, or other similar materials. In another embodiment, the nozzle (not shown) may be relatively hard and composed of a material such as, for example, a carbide, tool steel, or ceramic material.

The paste used to form the first layer lines 106 may be a conductive paste, composed of any conductive material commonly used in the art for screen printing processes. In one embodiment, the conductive paste may be composed of a single metal-containing paste or a combination of multiple metal-containing pastes. The metal-containing paste may be composed of a metal such as, for example, copper, molybdenum, nickel, tungsten, metal with glass frit, and metal with glass grit. In another embodiment, the paste may be composed of an insulative paste. In yet another embodiment, the paste may be composed of a combination of a conductive paste and an insulative paste. In yet another embodiment, the first layer lines 106 may be composed of more than one layer of paste, each layer having a different composition. After the first layer lines 106 are deposited, the mask (not shown) may be removed.

The first layer lines 106 may be composed of a first layer left line 108 and a first layer right line 110. In one embodiment, the first layer left line 108 may have an opposite polarity as the first layer right line 110. The first layer left line 108 and first layer right line 110 may run parallel to each other, separated by a substantially constant distance. Although FIG. 1 shows the first layer lines 106 running in a straight line across the first greensheet 104, it is contemplated that in some embodiments, the first layer lines 106 may follow a path across a length $L_1$ of the first greensheet 104 that bends at right angles.

Figure 2:
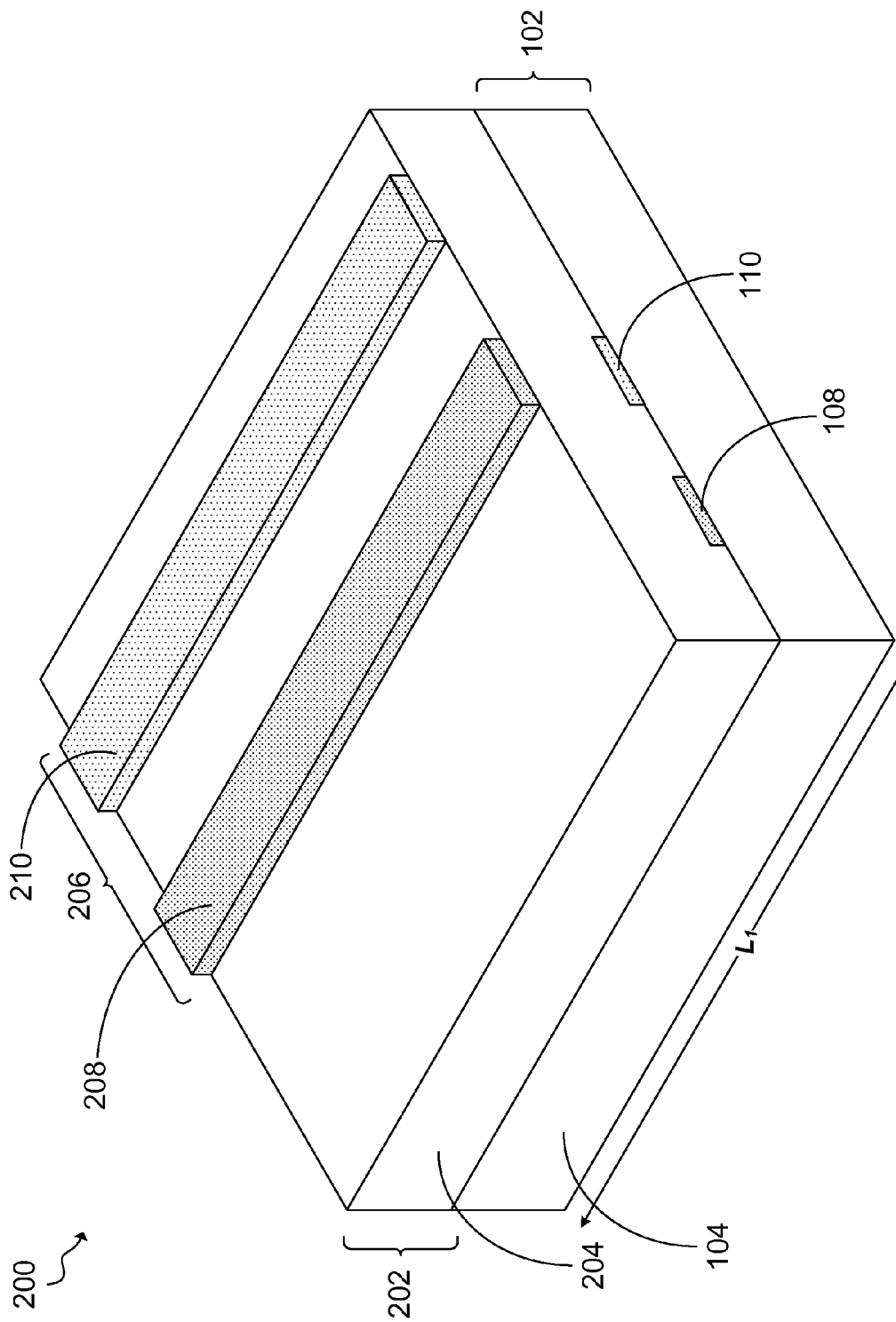
FIG. 2 is an isometric view illustrating forming a second layer and a second pair of lines on the first greensheet, according to an embodiment of the present invention.

Referring now to FIG. 2, an isometric view of a structure 200 is shown. FIG. 2 illustrates forming a second layer 202 by positioning a second greensheet 204 directly on the first greensheet 104. The second greensheet 204 may be substantially similar to the first greensheet 104. In one embodiment, the second greensheet 204 may be aligned to the first greensheet 104 and stacked on top of it. In another embodiment, the first greensheet 104 may be secured to the second greensheet 204 by any standard bonding and/or tacking process commonly used in the art such as, for example, a standard lamination process. The bonding and/or tacking process used should not distort the first layer lines 106 on the first greensheet 104. In one embodiment, a lamination process may be conducted at pressures less than approximately 800 psi and at temperatures less than approximately 90° C.

In one embodiment a second pair of lines 206 (hereinafter "second layer lines"), including a second layer left line 208 and a second layer right line 210, may be formed on the second greensheet 204. The second layer lines 206 may be substantially similar to the first layer lines 106 (FIG. 1) and may be formed by substantially similar techniques as those described above with reference to FIG. 1. The second greensheet 204 may include one or more pre-punched vias (not shown) that extend through the entire thickness of the second greensheet 204.

In one embodiment, the second layer lines 206 may be formed on the second greensheet 204 so that they are staggered, or offset, from the first layer lines 106 (FIG. 1). In one embodiment, the second layer lines 206 may be positioned on the second greensheet 204 so that the second layer left line 208 is aligned above the first layer right line 110 to aid in the reduction of noise coupling. In one embodiment, the second layer left line 208 may have the same polarity as the first layer left line 108 and the second layer right line 210 may have the same polarity as the first layer right line 110. In embodiments in which the first layer lines 106 (FIG. 1) follow a path that bends at right angles, the second layer lines 206 may follow the same pattern so that the second layer left line 208 remains above the first layer right line 110.

Figure 3:
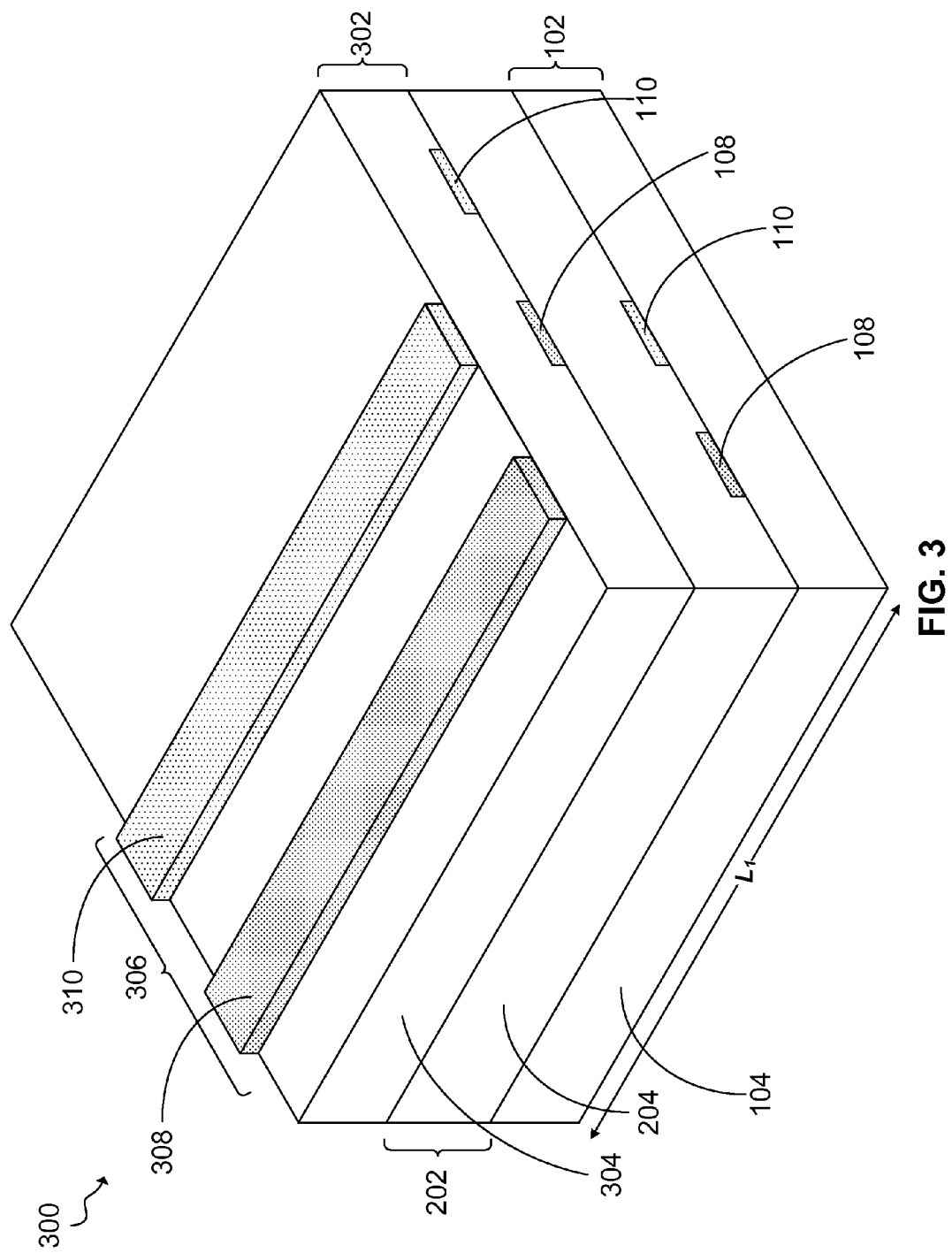
FIG. 3 is an isometric view illustrating forming a third layer and a third pair of lines on the second layer, according to an embodiment of the present invention.

Referring now to FIG. 3, an isometric view of a structure 300 is shown. FIG. 3 illustrates forming a third layer 302 directly on the second layer 202 by positioning a third greensheet 204 directly on the second greensheet 104. The third layer 302 may be formed by substantially similar techniques as those used to form the second layer 202 as described above with reference to FIG. 2. The third greensheet 304 may include one or more pre-punched vias (not shown) that extend through the entire thickness of the third greensheet 304.

In one embodiment, a pair of third layer lines 306 (hereinafter "third layer lines"), including a third layer left line 308 and a third layer right line 310, may be formed on the third greensheet 304. The third layer lines 306 may be substantially similar to the first layer lines 106 (FIG. 1) and may be formed by substantially similar techniques as those used to form the first layer lines 106 as described above with reference to FIG. 1.

In one embodiment, the third layer lines 306 may be formed on the greensheet 304 so that they are staggered, or offset, from the second layer lines 206 (FIG. 2) and are vertically aligned with the first layer lines 106 (FIG. 1). In one embodiment, the third layer lines 306 may be formed on the third greensheet 304 so that the third layer right line 310 may be aligned above the second layer left line 208. In one embodiment, the third layer left line 308 may have the same polarity as the first layer left line 108 and the third layer right line 310 may have the same polarity as the first layer right line 110. In embodiments in which the second layer lines 206

(FIG. 2) follow a path that bends at right angles, the third layer lines 306 may follow the same pattern so that the third layer right line 308 remains above the second layer left line 208. In one embodiment, additional greensheets may be used to form additional layers on the third layer 302.

After the third layer 302 is formed, the structure 300 may be subjected to any conventional sintering process known in the art in order to harden the greensheets used in each of the layers and transform the structure 300 into a solid ceramic MLC. The sintering process may involve subjecting the structure 300 to very high temperatures for an extended period of time and gradually cooling the structure 300 down to avoid thermal shock. In one embodiment, the sintering process may involve a binder burn-off phase. For example, in one embodiment, the temperature may be gradually raised to the final sintering temperature of approximately 1500° C. over a time period of approximately 6 hrs to burn off the binder material present in the greensheet. The structure 300 may be maintained at this elevated temperature for a period of approximately 3 to 7 hours in order to sinter the alumina particles. Thereafter, a slow controlled cool down step may be conducted to bring the structure 300 back down to room temperature. In another embodiment, an accelerated sintering process may be used.

Figure 4:
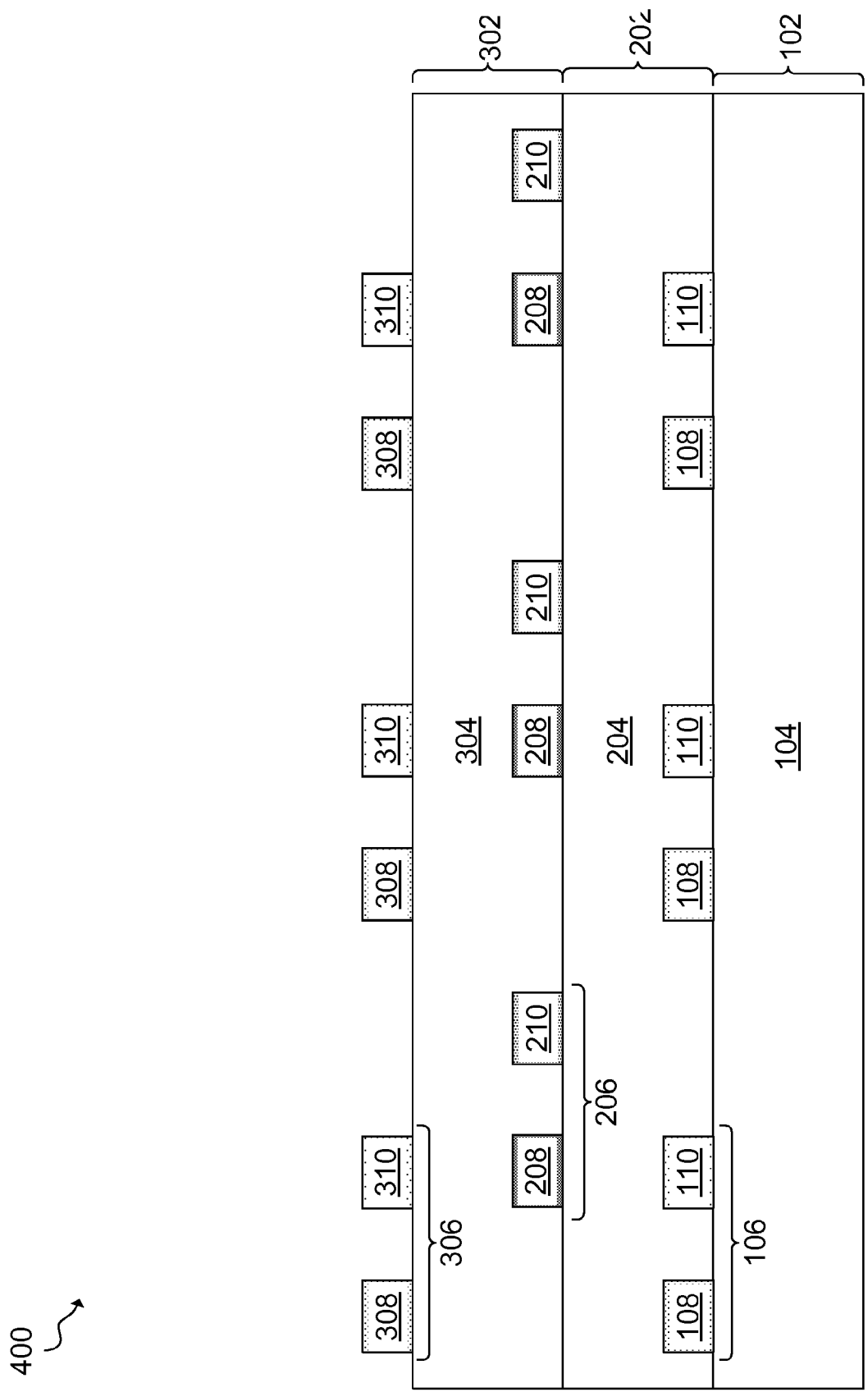
FIG. 4 is a cross-section view of a front side of the structure shown in FIG. 3 after it has undergone the sintering process to transform it into a solid ceramic MLC, according to an embodiment of the present invention.

Referring now to FIG. 4, a cross-section view of a front side of the structure 300 is shown. FIG. 4 illustrates the front side of the structure 300 after it has undergone the sintering process to transform it into a solid ceramic MLC. In one embodiment, the third layer 302 may be directly on the second layer 202 which, in turn, may be directly on the first layer 102. The third layer lines 306 may be staggered, or offset, from the second layer lines 206 so that the third layer right line 310 is aligned vertically with the second layer left line 208. In addition, the second layer lines 206 may be staggered, or offset, from the first layer lines 106 so that the second layer left line 208 is aligned vertically with the first layer right line 110. The third layer lines 306 may be aligned vertically with the first layer lines 106 so that the third layer left line 308 is vertically aligned with the first layer left line 108 and the third layer right line 310 is aligned vertically with the first layer right line 110.

In another embodiment, signal delay, package impedance, and cross-talk may be further reduced by not only staggering pairs of lines in each layer, but also periodically reversing the polarity of a pair of lines in a first layer and a pair of lines in a third layer by routing them through a second layer using via contacts. This embodiment may be described in detail below with reference to FIGS. 5-9.

Figure 5:
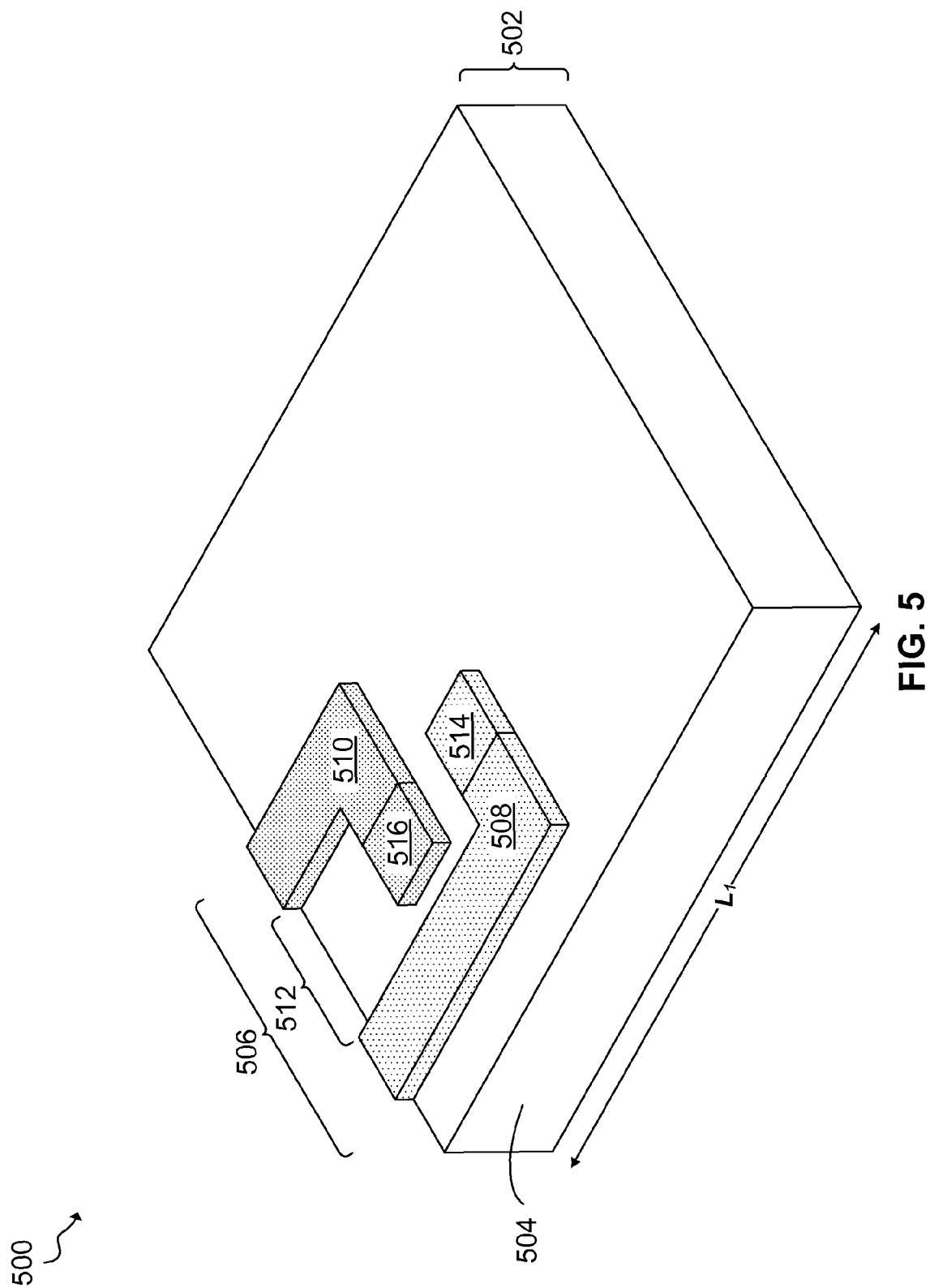
FIG. 5 is an isometric view illustrating forming a first pair of lines including contacts, on a first greensheet to form a first layer, according an embodiment of the present invention.

Referring now to FIG. 5, an isometric view of a structure 500 is shown. FIG. 5 illustrates forming a pair of first layer lines 506 (hereinafter "first layer lines") on a first greensheet 504 to form a first layer 502. The first greensheet 504 may be substantially similar to the first greensheet 104 (FIG. 1) and formed using substantially similar techniques as those described above with reference to FIG. 1. In addition, the first layer lines 506 may be substantially similar to the first layer lines 106 (FIG. 1) and formed using substantially similar techniques as those described above with reference to FIG. 1. The first layer lines 506 may include a first layer left line 508 and a first layer right line 510. The first layer left line 508 may have an opposite polarity as the first layer right line 510. Although FIG. 5 shows the first layer lines 506 running in a straight line across the first greensheet 504, it is contemplated that in some embodiments, the first layer lines 506 may follow a path across a length $L_1$ of the first greensheet 504 that bends at right angles.

The pattern of the first layer lines 506 may be different than the first layer lines 106 (FIG. 1). In one embodiment, the first layer left line 508 and the first layer right line 510 may have portions that bend into an intervening portion 512 of the first greensheet 504 located between the first layer left line 508 and the first layer right line 510. The first layer left line 508 may include a first layer left contact 514 in the intervening portion 512. The first layer right line 510 may have a first layer right contact 516 in the intervening portion 512. The first layer left contact 514 and the first layer right contact 516 may have a similar composition as the first layer lines 506 and may be formed in the same step. The first layer left contact 514 and the first layer right contact 516 may serve to connect the first layer lines 506 to additional lines formed in subsequent layers, as described in more detail below.

Figure 6:
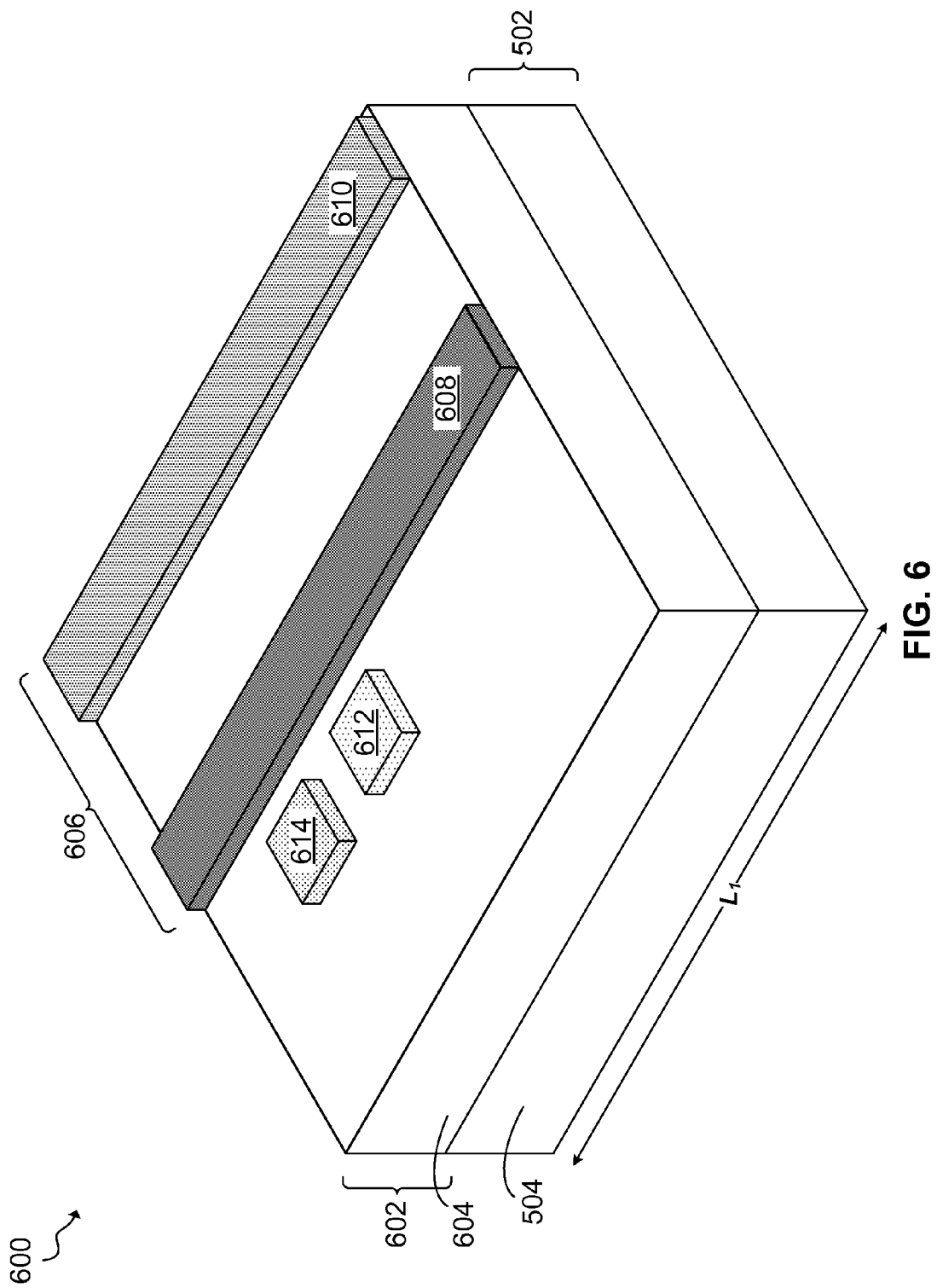
FIG. 6 is an isometric view illustrating forming a second layer, a second pair of lines, and contacts on the first greensheet, according to an embodiment of the present invention.

Referring now to FIG. 6, an isometric view of a structure 600 is shown. FIG. 6 illustrates forming a second layer 602 directly on the first layer 502 by positioning a second greensheet 604 directly on the first greensheet 504. The second greensheet 604 may be substantially similar to the second greensheet 204 (FIG. 2) and the second layer 602 may be formed using substantially similar techniques as those described above with reference to FIG. 2. The second layer 602 may include a second pair of lines 606 (hereinafter "second layer lines"), including a second layer left line 608 and a second layer right line 610, formed on the second greensheet 604. The second layer lines 606 may be substantially similar to the second layer lines 206 (FIG. 2) and formed using substantially similar techniques as those described above with reference to FIG. 2.

The second layer lines 606 may be formed so they are staggered, or offset, from the first layer lines 506 (FIG. 5). In other words, the second layer left line 608 may be aligned vertically with the first layer right line 510 (FIG. 5). In embodiments in which the first layer lines 506 (FIG. 5) follow a path that bends at right angles, the second layer lines 606 may follow the same pattern so that the second layer left line 608 remains above the first layer right line 510 (FIG. 5). The second layer left line 608 may have the same polarity as the first layer right line 510 (FIG. 5) and the second layer right line 610 may have the same polarity as the first layer left line 508 (FIG. 5).

In one embodiment, the second layer 602 may also include first contact 612 and a second contact 614. The first contact 612 and the second contact 614 may be formed by filling pre-punched vias (not shown) formed through the entire thickness of the second greensheet 604 with the conductive paste used to form the second layer lines 606. In one embodiment, the first contact 612 and the second contact 614 may be formed simultaneously with the second layer lines 606. The first contact 612 may be vertically aligned with and may contact the first layer left line 508 (FIG. 5) at the first layer left contact 514 (FIG. 5). The second contact 614 may be vertically aligned with and may contact the first layer right line 510 (FIG. 5) at the first layer right contact 516 (FIG. 5).

Figure 7:
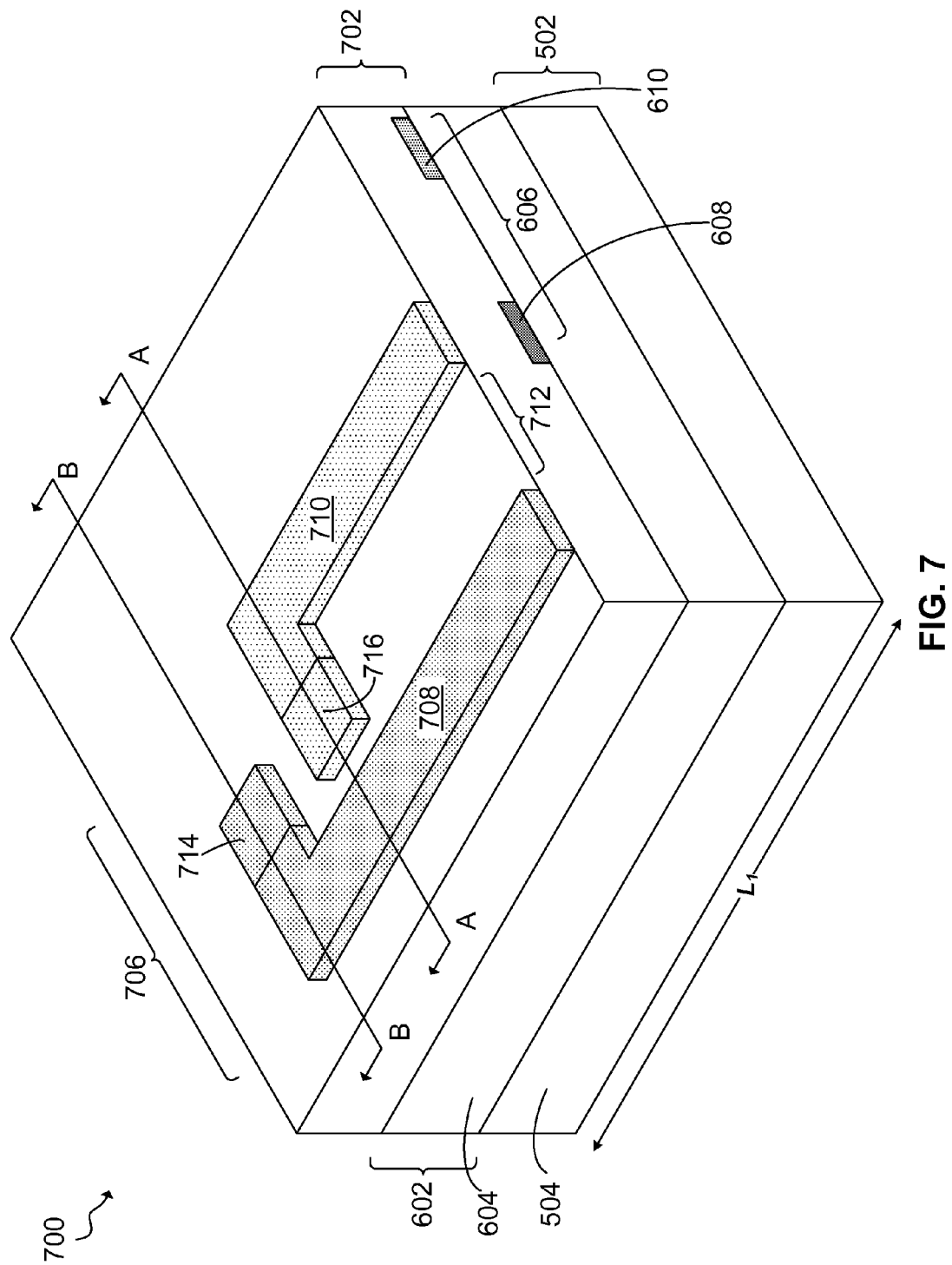
FIG. 7 is an isometric view illustrating forming a third layer and a third pair of lines, including contacts, on the second layer, according an embodiment of the present invention.

Referring now to FIG. 7, an isometric view of a structure 700 is shown. FIG. 7 illustrates forming a third layer 702 directly on the second layer 602 by positioning a third greensheet 704 directly on the second greensheet 604. The third greensheet 704 may be substantially similar to the third greensheet 304 (FIG. 3) and the third layer 702 may be formed using substantially similar techniques as those used to form the third layer 302 (FIG. 3) as described above with reference to FIG. 3.

The third layer 702 may include a third pair of lines 706 (hereinafter "third layer lines"), including a third layer left line 708 and a third layer right line 710, formed on the third greensheet 704. The third layer lines 706 may be substantially similar to the third layer lines 306 (FIG. 3) and may be formed using substantially similar techniques as those described above with reference to FIG. 3. The third layer lines 706 may be formed so they are staggered, or offset, above the second layer lines 606 (FIG. 6). In other words, the third layer right line 710 may be aligned vertically with the second layer left line 608 (FIG. 6). In embodiments in which the second layer lines 606 follow a path that bends at right angles, the third layer lines 706 may follow the same pattern so that the third layer right line 710 remains above the second layer left line 608. The third layer left line 708 may have the same polarity as the second layer left line 608 and the third layer right line 710 may have the same polarity as the second layer right line 610.

The pattern of the third layer lines 706 may be different than the third layer lines 306 (FIG. 3). In one embodiment, the third layer left line 708 and the third layer right line 710 may have portions that bend into an intervening portion 712 of the third greensheet 704 located between the third layer left line 708 and the third layer right line 710. The third layer left line 708 may have a third layer left contact 714 present in the intervention portion 712. The third layer right line 710 may have a third layer right contact 716 present in the intervening portion 712. The third layer left contact 714 and the third layer right contact 716 may have a similar composition as the first layer lines 506 and may be formed by filling pre-punched vias (not shown) that extend through the entire thickness of the third greensheet 704 with the paste used to form the third layer lines 706. The third layer left contact 714 may be vertically aligned with and may contact the second contact 614 (FIG. 6), which may then contact the first layer right line 510 (FIG. 5) at the first layer right contact 516 (FIG. 5). The third layer right contact 716 may be vertically aligned with and may contact the first contact 612 (FIG. 6), which may then contact the first layer left line 508 (FIG. 5) at the first layer left contact 514 (FIG. 5).

After the third layer 702 is formed, the structure 700 may be subjected to any conventional sintering process known in the art in order to harden the greensheets used in each of the layers and transform the structure 700 into a solid ceramic MLC. The sintering process may involve subjecting the structure 700 to very high temperatures for an extended period of time and gradually cooling the structure 700 down to avoid thermal shock. In one embodiment, the sintering process may involve a binder burn-off phase. For example, in one embodiment, the temperature may be gradually raised to the final sintering temperature of approximately 1500° C. over a time period of approximately 6 hrs to burn off the binder material present in the greensheet. The structure 700 may be maintained at this elevated temperature for a period of approximately 3 to 7 hours in order to sinter the alumina particles. Thereafter, a slow controlled cool down step may be conducted to bring the structure 700 back down to room temperature. In another embodiment, an accelerated sintering process may be used.

The wiring pattern of the structure 700 may allow for the third layer left line 708 to connect to the first layer right line 510 (FIG. 5) and for the third layer right line 710 to connect to the first layer left line 508 (FIG. 5), thereby reversing the polarity of the lines (for example, negative on the right side and positive on the left side in the third layer lines 706 and negative on the left side and positive on the right side in the first layer lines 506 (FIG. 5). Structure 700 may be repeated multiple times throughout a total length of the MLC so that the polarity of the third layer lines 706 and the first layer lines 506 (FIG. 5) periodically reverse polarity.

Figure 8:
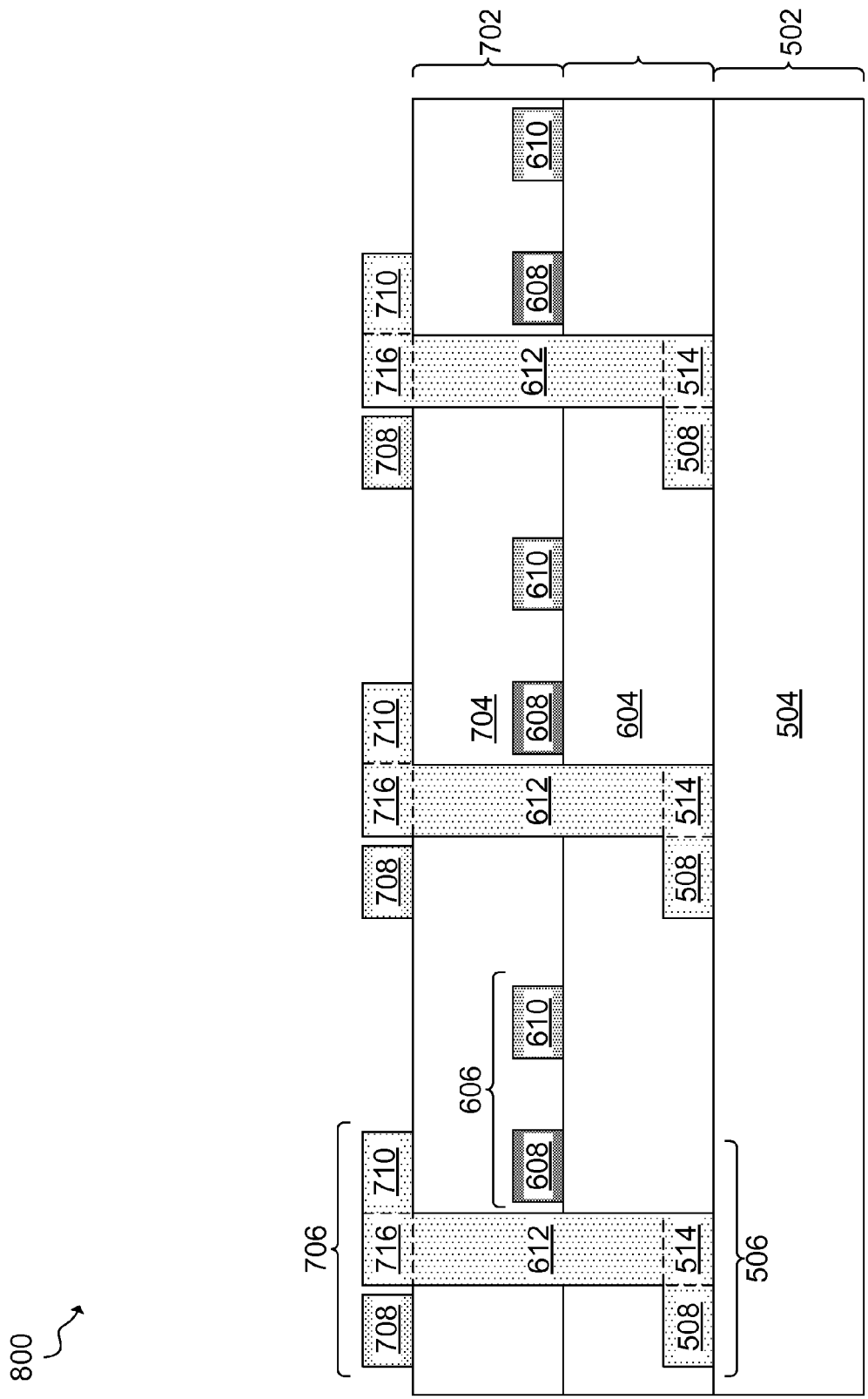
FIG. 8 is a cross-section view the structure shown in FIG. 7 after it has undergone a sintering process, taken along a section line A-A.

Referring now to FIG. 8, a cross-section view of the structure 700 taken along section line A-A (FIG. 7) is shown. FIG. 8 illustrates the structure 700 after it has undergone the sintering process to transform it into a solid ceramic MLC. In one embodiment, the third layer lines 706 may run in a direction that goes into the page, and may drop down to the first layer 502 through the first contact 612 and the second contact 614 (not shown). The third layer right line 710 may be connected to the first contact 612 by the third layer right contact 716. The first layer left line 508 may be connected to the first contact 612 by the first layer left contact 514. The second contact 614 (not shown) may be directly behind the first contact 612.

The third layer 702 may be directly on the second layer 602 which, in turn, may be directly on the first layer 502. The third layer lines 706 may be staggered above the second layer lines 606 so that the third layer right line 710 is aligned vertically with the second layer left line 608. In addition, the second layer lines 606 may be staggered above the first layer lines 506 so that the second layer left line 608 is aligned vertically with the first layer right line 510 (not shown). The third layer lines 706 may be aligned vertically with the first layer lines 506 so that the third layer left line 708 is vertically aligned with the first layer left line 508 and the third layer right line 710 is aligned vertically with the first layer right line 510 (not shown).

Figure 9:
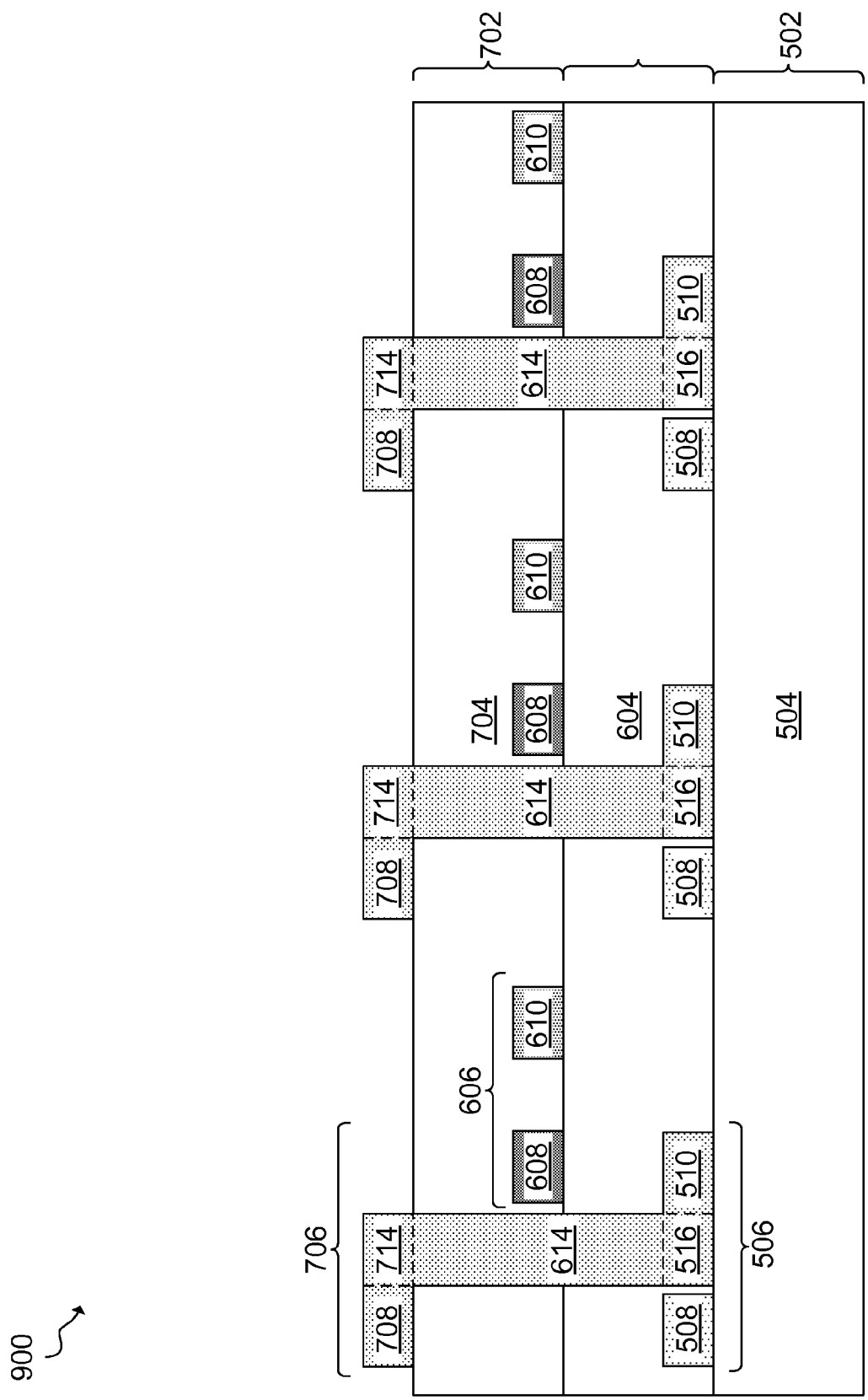
FIG. 9 is a cross-section view the structure shown in FIG. 7 after it has undergone the sintering process, taken along a section line B-B.

Referring now to FIG. 9, a cross-section view of the structure 700 taken along section line B-B (FIG. 7) is shown. FIG. 9 illustrates the structure 700 after it has undergone the sintering process to transform it into a solid ceramic MLC. In one embodiment, the first layer lines 506 may run in a direction that goes into the page, and may be connected to the third layer lines 706 through the first contact 612 (not shown) and the second contact 614. The third layer left line 708 may be connected to the second contact 614 by the third layer left contact 714. The first layer right line 510 may be connected to the second contact 614 by the first layer right contact 516. The first contact 612 (not shown) may be directly in front of the second contact 614 and is not visible in this cross-sectional view.

As described above, embodiments that include a staggered wiring pattern as well as periodic reversing of polarity may improve wiring performance in MLCs as well as reduce packaging density. The staggered wiring pattern may eliminate the need for an additional blank insulating layer between wiring layers without drastically sacrificing performance. In addition, the proposed staggered wiring pattern may offer the same compact packaging density as MLCs without a blank insulating layer, but with significantly less signal delay, package impedance, and cross-talk. Finally, periodically reversing the polarity of the staggered lines may provide better performance than MLCs with a blank insulating layer with a drastically reduced packaging density.

Conventional MLCs having a mesh wiring pattern with a blank insulating layer between each wiring layer may reduce cross-talk between vertical layers by approximately 29.5 dB as compared to a conventional MLC having a mesh wiring pattern with no insulating layers. However, the additional insulating layer between each wiring layer in conventional MLCs adds a significant amount of material to applications that can benefit from a reduction of package density. Embodiments described above having staggered lines formed in wiring layers directly on top of one another may reduce cross-talk between vertical layers by approximately 25.7 dB as compared to a conventional MLC having a mesh wiring pattern with no insulating layers. In other words, the noise coupling reduction is comparable to conventional MLCs having insulating layers, but the package density is significantly decreased.

Furthermore, embodiments described above in which the polarity of the first layer lines and the third layer lines are periodically reversed, may reduce cross-talk between vertical layers by approximately 38.6 dB as compared to a conventional MLC having a mesh wiring pattern with no insulating layers. In other words, these embodiments provide better noise coupling reduction than conventional MLCs having insulating layers along with a significant reduction in package density. Embodiments incorporating a combination of staggered wiring and periodic reversing of polarity may improve the signal to cross talk ratio enough to allow on-module buses to run up to approximately 40 Gbps.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a glass-ceramic carrier having multiple layers formed directly on top of one another, wherein a first layer contains a first layer left line and a first layer right line, a second layer contains a second layer left line and a second layer right line which are vertically offset from the first layer left line and the first layer right line, and a third layer contains a third layer left line and a third layer right line which are vertically aligned with the first pair of lines, wherein the third layer left line is connected to the first layer right line, wherein the third layer right line is connected to the first layer left line, and wherein the second layer left line and the second layer right line are not connected to any of the first layer left line, the first layer right line, the third layer left line, or the third layer right line.

2. The method of claim 1, wherein: the first layer left line has a polarity and the first layer right line has an opposite polarity; the second layer left line has the same polarity as the first layer left line and the second layer right line has the same polarity as the first layer right line; and the third layer left line has the same polarity as the first layer left line and the third layer right line has the same polarity as the first layer right line.

3. The method of claim 1, further comprising:
    forming a first contact from an intervening portion of the third layer located between the third layer left line and the third layer right line to an intervening portion of the first layer located between the first layer left line and the first layer right line, through an entire thickness of the second layer, the first contact providing an electrical connection between the third layer right line and the first layer left line which have the same polarity as the second layer right line; and forming a second contact from the intervening portion of the third layer to the intervening portion of the first layer, through the entire thickness of the second layer, the second contact providing an electrical connection between the third layer left line and the first layer right line which have the same polarity as the second layer left line.

4. A method comprising:
    forming a first pair lines on a first greensheet, the first pair of lines comprising a first layer left line and a first layer right line separated by an intervening portion of the first greensheet;
    positioning a second greensheet on the first greensheet;
    forming a second pair of lines on the second greensheet, the second pair of lines comprising a second layer left line and a second layer right line separated by an intervening portion of the second greensheet, wherein the second layer left line is vertically aligned with the first layer right line;
    positioning a third greensheet on the second greensheet;
    forming a third pair of lines on the third greensheet, the third pair of lines comprising a third layer left line and a third layer right line separated by an intervening portion of the third greensheet, wherein the third layer left line is vertically aligned with the first layer left line and the third layer right line is vertically aligned with the second layer left line; and
    performing a sintering process to harden and join the first greensheet, the second greensheet, and the third greensheet together to form a solid glass-ceramic multilayer carrier, wherein the third layer left line is connected to the first layer right line, wherein the third layer right line is connected to the first layer left line, and wherein the second layer left line and the second layer right line are not connected to any of the first layer left line, the first layer right line, the third layer left line, or the third layer right line.

5. The method of claim 4, wherein the forming the first pair of lines on the first greensheet, the forming the second pair of lines on the second greensheet, and the forming the third pair of lines on the third greensheet comprises:
    depositing a layer of conductive paste on said greensheets in a chosen pattern using a screen printing process.

6. The method of claim 4, wherein the positioning the second greensheet on the first greensheet and the positioning the third greensheet on the second greensheet comprise:
    performing a lamination process to secure and temporarily join said greensheets.

7. The method of claim 4, wherein the third layer left line has the same polarity as the second layer left line and the first layer left line, and wherein the third layer right line has the same polarity as the second layer right line and the first layer right line.

8. The method of claim 4, wherein the third layer left line has the same polarity as the second layer left line and the first layer right line, and wherein the third layer right line has the same polarity as the second layer right line and the first layer left line.

9. The method of claim 4, further comprising:
    forming a first layer left contact in the intervening portion of the first greensheet connected to the first layer left line;
    forming a first layer right contact in the intervening portion of the first greensheet connected to the first layer right line;

forming a first contact through an entire thickness of the second greensheet, the first contact being vertically aligned with and contacting the first layer left contact;

forming a second contact through the entire thickness of the second greensheet, the second contact being vertically aligned with and contacting the first layer right contact;

forming a third layer left contact through an entire thickness of the third greensheet in the intervening portion of the third greensheet, connected to the third layer left line; the third layer left contact being vertically aligned with and contacting the second contact; and forming a third layer right contact through an entire thickness of the third greensheet in the intervening portion of the third greensheet, connected to the third layer right line; the third layer right contact being vertically aligned with and contacting the first contact.

10. The method of claim 9, wherein the forming the first contact, the forming the second contact, the forming the third layer left contact, and the forming the third layer right contact comprises:

forming a via through the entire thickness of said second and third greensheets; and depositing a layer of conductive paste on said second and third greensheets in a chosen pattern using a screen printing process, the conductive paste filling the via.

11. The method of claim 9, wherein the forming the first contact through the entire thickness of the second greensheet and the forming the second contact through the entire thickness of the second greensheet comprise:

forming a via through the entire thickness of the second greensheet; and filling the via with a conductive paste.

12. The method of claim 11, wherein the forming the via through the entire thickness of the second greensheet comprises:

forming a via hole through the entire thickness of the second greensheet using a punch before positioning the second greensheet on the first greensheet.

* * * * *